(12) United States Patent
Wakisaka et al.

(10) Patent No.: US 10,803,576 B2
(45) Date of Patent: Oct. 13, 2020

(54) DEFECT INSPECTION APPARATUS AND DEFECT INSPECTION METHOD

(71) Applicant: TOSHIBA MEMORY CORPORATION, Minato-ku (JP)

(72) Inventors: Kenji Wakisaka, Yokkaichi (JP); Osamu Nagano, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 219 days.

(21) Appl. No.: 16/125,946

(22) Filed: Sep. 10, 2018

(65) Prior Publication Data
US 2019/0244336 A1 Aug. 8, 2019

(30) Foreign Application Priority Data

Feb. 6, 2018 (JP) .................................. 2018-019447

(51) Int. Cl.
*G06K 9/00* (2006.01)
*G06T 7/00* (2017.01)
(Continued)

(52) U.S. Cl.
CPC ............. *G06T 7/001* (2013.01); *G01N 21/88* (2013.01); *G01N 21/8803* (2013.01);
(Continued)

(58) Field of Classification Search
CPC ....... G06T 7/00; G06T 7/0002; G06T 7/0004; G06T 7/0006; G06T 7/0008; G06T 7/001;
(Continued)

(56) References Cited

U.S. PATENT DOCUMENTS 7,440,092 B2 * 10/2008 Shibata .............. G01N 21/9501
382/149
7,492,942 B2 2/2009 Ishikawa et al.
(Continued)

FOREIGN PATENT DOCUMENTS

JP 2004-239728 8/2004
JP 2008-39743 2/2008

*Primary Examiner* — Eric Rush
(74) *Attorney, Agent, or Firm* — Oblon, McClelland, Maier & Neustadt, L.L.P.

(57) ABSTRACT

An imaging portion acquires first sample-images of a first sample under optical-conditions, the first sample having a defect, and acquires second sample-images of a second sample under optical-conditions, the second sample having no defects. An arithmetic portion calculates a first difference between a first sample-image taken under a first optical-condition and the first sample-image taken under a second optical-condition, calculates a second difference between a second sample-image taken under the first optical-condition and a second sample-image taken under the second optical-condition, and selects the first and second optical-conditions under which a difference between the first and second differences becomes largest, as a first and a second inspection-condition. The imaging portion takes images of the target to be inspected under the first and second inspection-conditions to acquire a first and second inspection-images. The arithmetic portion performs inspection based on the difference between the first and second inspection-images.

16 Claims, 4 Drawing Sheets

(51) Int. Cl.
  *G06T 7/90* (2017.01)
  *H04N 5/225* (2006.01)
  *G01N 21/88* (2006.01)
  *G06K 9/62* (2006.01)
  *G01N 21/956* (2006.01)
  *G01N 21/95* (2006.01)

(52) U.S. Cl.
  CPC ..... *G01N 21/8806* (2013.01); *G01N 21/8851* (2013.01); *G01N 21/9501* (2013.01); *G01N 21/95607* (2013.01); *G06K 9/6202* (2013.01); *G06T 7/0002* (2013.01); *G06T 7/0004* (2013.01); *G06T 7/0006* (2013.01); *G06T 7/90* (2017.01); *H04N 5/2256* (2013.01); *G01N 2021/8809* (2013.01); *G06T 2207/30148* (2013.01)

(58) Field of Classification Search
  CPC ............. G06T 7/90; G06T 2207/10141; G06T 2207/10144; G06T 2207/10148; G06T 2207/10152; G06T 2207/30148; G06K 9/6202; H04N 5/225; H04N 5/2256; H01L 22/12; H01L 22/20; H01L 22/24; G01N 21/00; G01N 21/01; G01N 21/88; G01N 21/8803; G01N 21/8806; G01N 21/8851; G01N 21/9501; G01N 21/956; G01N 21/95607; G01N 2021/8809; G01N 2021/8835; G01N 2021/8861; G01N 2021/887; G01N 2021/8887

USPC ................ 382/100, 112, 141, 144–152, 209, 382/217–221, 224; 356/237.1, 237.2, 356/237.3, 237.4, 237.5, 238.1, 239.3, 356/239.7, 239.8; 348/86, 125, 126, 348/128–133; 700/110, 117, 121; 716/50–52, 112
  See application file for complete search history.

(56) References Cited

U.S. PATENT DOCUMENTS

| | | | |
|---|---|---|---|
| 8,103,087 B2 * | 1/2012 | Maeda | G06T 7/001 382/149 |
| 8,340,395 B2 * | 12/2012 | Sakai | G06T 7/001 382/149 |
| 8,605,275 B2 * | 12/2013 | Chen | G01N 21/9501 356/237.2 |
| 8,660,336 B2 * | 2/2014 | Ueno | G01N 21/9501 382/149 |
| 9,678,442 B2 * | 6/2017 | Tam | G03F 7/70666 |
| 10,190,989 B2 * | 1/2019 | Touma | G06T 7/0008 |
| 10,416,088 B2 * | 9/2019 | Duffy | H01J 37/222 |
| 2008/0040064 A1 | 2/2008 | Ishikawa | |
| 2009/0281778 A1 * | 11/2009 | Belledent | G03F 1/36 703/6 |

* cited by examiner

… (1)

DEFECT INSPECTION APPARATUS AND DEFECT INSPECTION METHOD

CROSS REFERENCE TO RELATED APPLICATIONS

This application is based upon and claims the benefit of priority from the prior Japanese Patent Application No. 2018-019447, filed on Feb. 6, 2018, the entire contents of which are incorporated herein by reference.

FIELD

Embodiments of the present invention relate to a defect inspection apparatus and a defect inspection method.

BACKGROUND

A pattern transferred to a semiconductor substrate using a lithography technique has a critical location where a defect such as an open-circuit or a short-circuit tends to occur. In order for mask design or to set lithography conditions, it is preferable to perform defect inspection at the critical location.

DETAILED DESCRIPTION

Embodiments will now be explained with reference to the accompanying drawings. The present invention is not limited to the embodiments. The drawings are schematic or conceptual, the scale and the like of each part thereof being not necessarily the same as actual ones. In the specification and drawings, the same signs are given to the same elements as those described with reference to the drawings previously shown, a detailed description thereof being omitted, as required.

A defect inspection apparatus according to the present embodiment is provided with an illuminating portion emitting light to a pattern. An imaging portion acquires a plurality of first sample images by taking images of the pattern in a first sample under a plurality of optical conditions, the first sample having a defect in a first area of the pattern, and acquiring a plurality of second sample images by taking images of the pattern in a second sample under a plurality of optical conditions, the second sample having no defects in the first area of the pattern. An arithmetic portion calculates a first difference between a first sample image taken under a first optical condition and a first sample image taken under a second optical condition, among the plurality of optical conditions, calculating a second difference between a second sample image taken under the first optical condition and a second sample image taken under the second optical condition, and selecting the first and second optical conditions under which a difference between the first and second differences becomes largest, as a first and a second inspection condition. The imaging portion takes images of the pattern in a target to be inspected under the first and second inspection conditions to acquire a first and a second inspection image. The arithmetic portion determines whether there is a defect in the first area of the pattern in the target based on a difference between the first and second inspection images.

(Configuration of Defect Inspection Apparatus 1)

Figure 1:
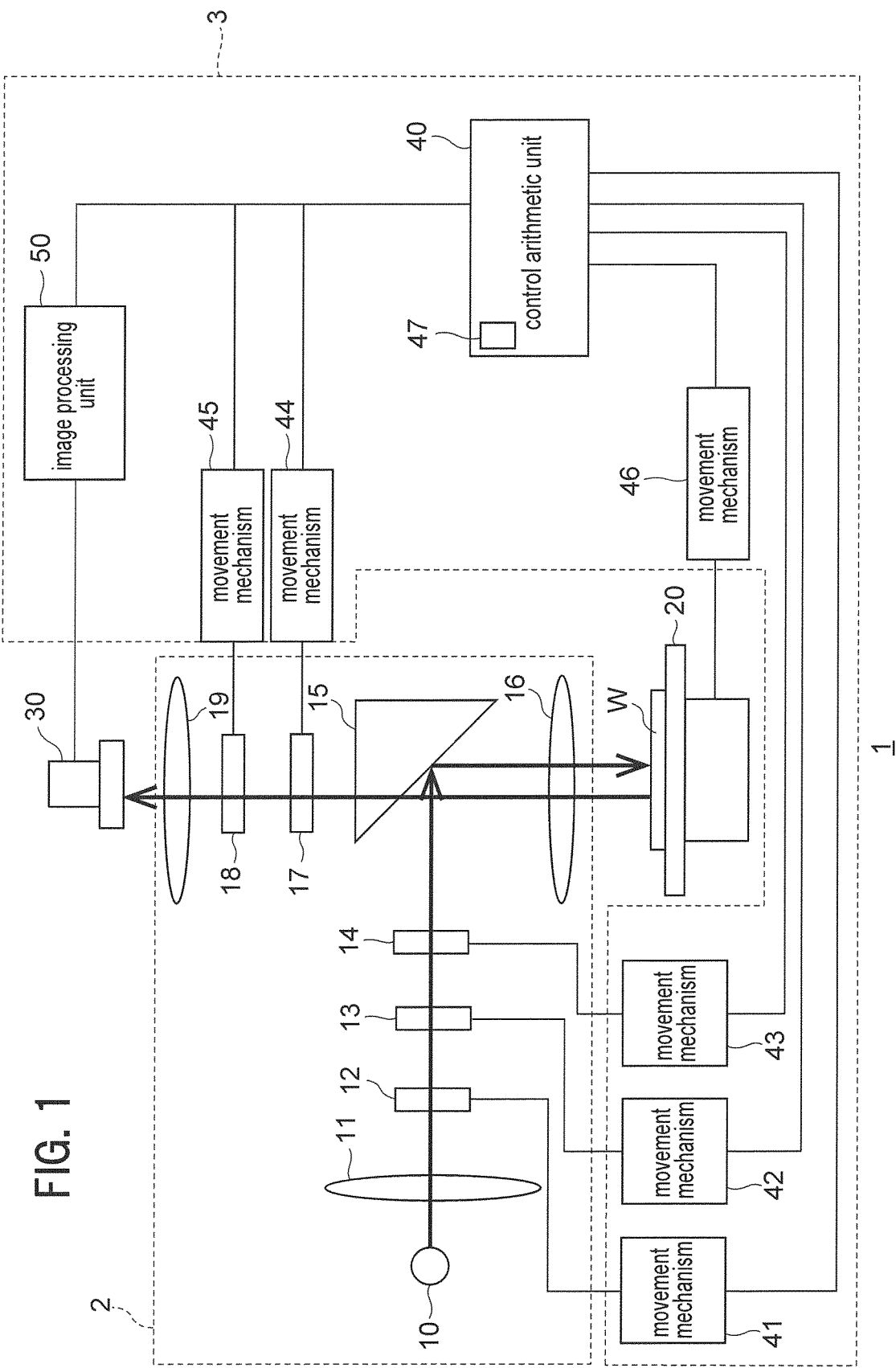
FIG. 1 is a block diagram showing a configuration example of a defect inspection apparatus according to the present embodiment.

FIG. 1 is a block diagram showing a configuration example of a defect inspection apparatus 1 according to the present embodiment. The defect inspection apparatus 1 takes an image of a pattern of a semiconductor substrate (a second substrate) W placed on a stage and inspects whether the pattern of the semiconductor substrate W has a defect, by means of the pattern image. For this purpose, the defect inspection apparatus 1 is provided with a light source 10, a lens 11, a wavelength selection filter 12, apertures 13 and 18, polarization filters 14 and 17, a half mirror 15, an objective lens 16, an imaging lens 19, a stage 20, a camera 30, a control arithmetic unit 40, movement mechanisms 41 to 45, and an image processing unit 50.

The light source 10 generates light of a wavelength in the range from ultraviolet light to infrared light. The lens 11 is provided to emit the light from the light source 10 to the wavelength selection filter 12, the aperture 13, and the polarization filter 14, as parallel beams.

The wavelength selection filter 12 allows light in a predetermined wavelength band in the light from the light source 10, to pass therethrough. The aperture 13 shapes light from the wavelength selection filter 12. The polarization filter 14 controls the polarization state of light that has passed through the aperture 13.

The half mirror 15 reflects light from the light source 10 toward the stage 20, whereas allows light from the stage 20 to pass therethrough. Therefore, the light from the light source 10 is reflected on the half mirror 15 and emitted to the semiconductor substrate W on the stage 20. Light reflected on the semiconductor substrate W passes through the half mirror 15 and propagates to the camera 30.

The objective lens 16 collects light from the half mirror 15 on the surface of the semiconductor substrate W. The polarization filter 17 controls the polarization state of light that has passed through the half mirror 15 after being reflected on the semiconductor substrate W. The aperture 18 shapes light from the polarization filter 17. The imaging lens 19 forms an image of light that has passed through the aperture 18, on the camera 30. Hereinbelow, the light source 10, the lens 11, the wavelength selection filter 12, the apertures 13 and 18, the polarization filters 14 and 17, the half mirror 15, the objective lens 16, and the imaging lens 19 all together are also referred to as an optical system 2.

The stage 20 can place the semiconductor substrate W thereon. The height of the stage 20 is controlled by the movement mechanism 46.

The camera 30 receives light from the optical system 2 to take an image of a pattern provided on the surface of the semiconductor substrate W. The camera 30 may, for example, be a line sensor having CCDs (Charge Coupled Devices) arranged in a row. As for the line sensor, for example, a TDI (Time Delay Integration) sensor may be used. An optical image of the pattern of the semiconductor substrate W is taken by the camera 30 via the optical system 2. In order to obtain an optical image preferable for inspection, it is important to perform focusing with accurate detection of a focal point of light to be emitted to the semiconductor substrate W. In order to adjust the focal point on the surface of the semiconductor substrate W (the surface on which the pattern is formed), the control arithmetic unit 40 uses an auto focusing function to adjust the height of the stage 20 via the movement mechanism 46.

The control arithmetic unit 40 is capable of controlling the optical system 2 and the stage 20 via the movement mechanisms 41 to 45. The control arithmetic unit 40 may be a CPU. The movement mechanism 41 is capable of changing the wavelength band of light that passes through the wavelength selection filter 12. The movement mechanism 42 is capable of changing the opening degree or opening shape of the aperture 13. The movement mechanism 43 is capable of changing the polarization state (polarization direction or the like) of the polarization filter 14. The movement mechanism 44 is capable of changing the polarization state (polarization direction or the like) of the polarization filter 17. The movement mechanism 45 is capable of changing the opening degree or opening shape of the aperture 18. The movement mechanism 46 is capable of varying the height (the position with respect to the objective lens 16). The control arithmetic unit 40 has a storage 47 to store a control program for each component of the defect inspection apparatus 1, the coordinates of critical locations which will be described later, images taken by the camera 30, and so on.

The image processing unit 50 performs A/D (Analogue-to-Digital) conversion of a pattern image received from the camera 30 and sends image data of the pattern image to the control arithmetic unit 40. The A/D-converted image data, for example, expresses the gradation of brightness of each pixel of the camera 30. The control arithmetic unit 40 inspects whether the pattern of the semiconductor substrate W has a defect, using the image data from the image processing unit 50. Hereinbelow, the control arithmetic unit 40, the movement mechanisms 41 to 46, and the image processing unit 50 all together are also referred to as a control system 3.

(Defect Inspection Method)

Subsequently, a defect inspection method using the defect inspection apparatus 1 described above will be explained.

Figure 8:
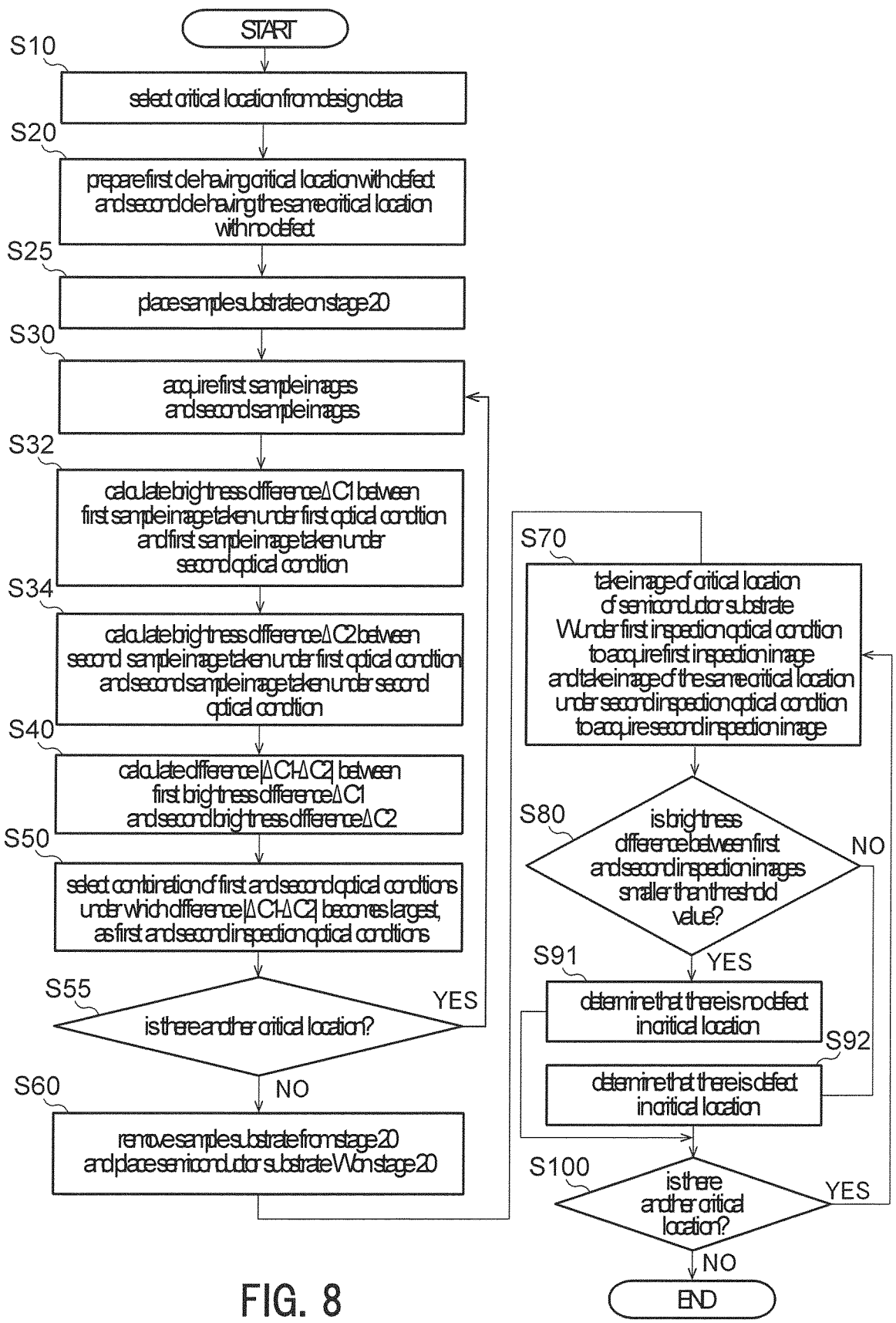
FIG. 8 is a flowchart showing an example of a defect inspection method according to the present embodiment.

FIG. 8 is a flowchart showing an example of the defect inspection method according to the present embodiment. The defect inspection method according to the present embodiment is suitable, for example, for a lithography step, an etching step, etc. in a manufacturing process of semiconductor devices and may be performed for pattern defect inspection on semiconductor substrates.

First of all, a critical location where a defect tends to occur is selected, in advance, from design data (S10). The critical location may be selected by referring to a wiring pattern or the like of the design data or automatically detected using a PC or software. Coordinates of the critical location are prestored in the storage 47.

Figure 2A:
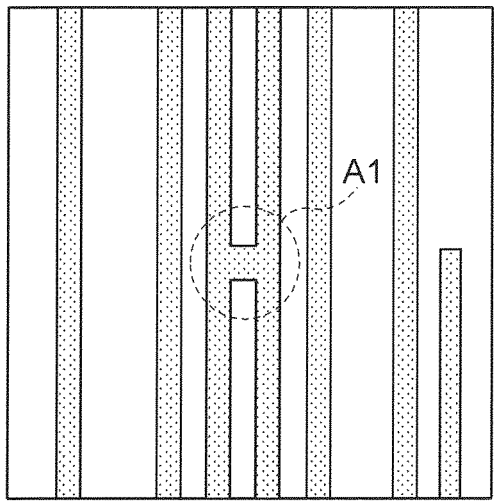
FIGS. 2A and 2B are illustrations showing image examples of critical locations of a first die.
Figure 2B:
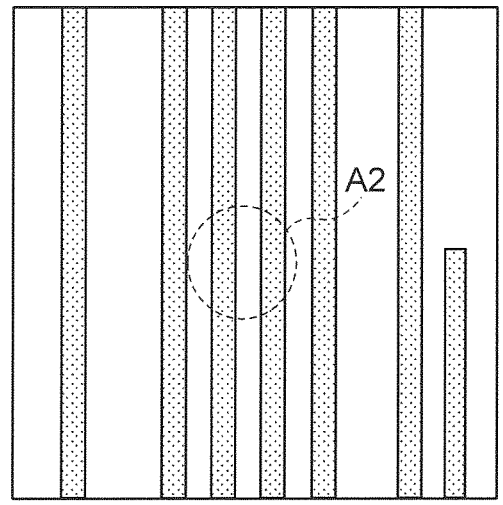

Subsequently, a first die having a critical location with a defect and a second die having the same critical location but with no defects are prepared in advance (S20). The first die (first sample) having a critical location with a defect and the second die (second sample) having a critical location with no defects are formed by changing the exposure condition of a lithography step in each die (each shot) of a semiconductor substrate (referred to as a sample substrate, hereinbelow) to be used as a sample. The exposure condition is, for example, focusing, an exposure time, etc. By changing the exposure condition of the lithography step for each die, a defect occurs in a critical location of a die, whereas no defect occurs in a critical location of another die. A die having a defect and another die having no defects are referred to as a first die and a second die, respectively. For example, FIG. 2A is an illustration showing an image example of a critical location A1 of the first die. The critical location A1 has a short-circuit failure as the defect. FIG. 2B is an illustration showing an image example of a critical location A2 of the second die. The critical location A2 has no defects.

Figure 3A:
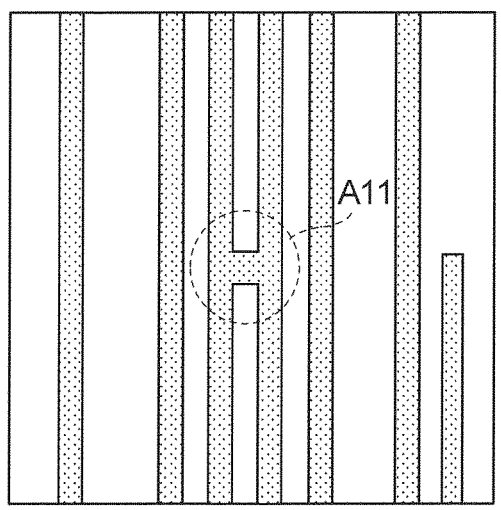
FIGS. 3A and 3B are illustrations showing image examples of short-circuit defects.
Figure 3B:
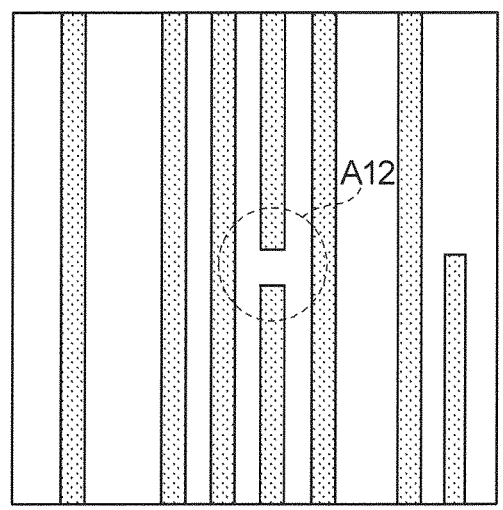

The defect is mainly classified into a short-circuit defect and an open-circuit defect. The short-circuit defect is a failure in which a plurality of wirings to be separated from one another are short-circuited. The open-circuit defect is a failure in which a wiring to be connected is cut halfway. For example, FIG. 3A is an illustration showing an image example of the short-circuit defect. A critical location A11 has a short-circuit failure as the defect. FIG. 3B is an illustration showing an image example of the open-circuit defect. A critical location A12 has an open-circuit failure as the defect. The critical location of the first die in FIG. 2A has the short-circuit defect shown in FIG. 3A.

Subsequently, a sample substrate including the first and second dies is placed on the stage 20 of FIG. 1 (S25). Succeedingly, the camera 30 takes images of the critical location of the first die under a plurality of optical conditions to acquire a plurality of first sample images that correspond to the plurality of optical conditions, respectively. Moreover, the camera 30 takes images of the second die under a plurality of optical conditions in the same way to acquire a plurality of second sample images that correspond to the plurality of optical conditions, respectively (S30). The plurality of first and second sample images are transferred to the image processing unit 50 of FIG. 1 and are A/D-converted. The image processing unit 50 further converts the plurality of first and second sample images into image data expressed in gradation (gray level) of brightness of each pixel of the camera 30. Hereinbelow, the image data (expressed in gray level) converted by the image processing unit 50 are referred to as a first and a second sample image. The first and second sample images are transferred to the control arithmetic unit 40 and stored in the storage 47.

The kind of optical condition may, for example, be either one of the wavelength of light emitted from the optical system 2 to the sample substrate, the polarization state of the light emitted from the optical system 2 to the sample substrate, the size or shape of the apertures 13 and 18 provided to the optical system 2, and an imaging plane location. When the camera 30 takes images of first and second dies D1 and D2, the control arithmetic unit 40 fixes the optical condition to a specific kind and changes the numerical value, state, size, shape, etc. with respect to the optical condition of that kind. Therefore, the following first and second optical conditions are different from each other in numerical value, state, size, shape, etc., concerning the kind of optical condition (wavelength, polarization state, aperture or imaging plane location).

For example, in the case where the light wavelength is changed as the optical condition, while the wavelength band of light passing through the wavelength selection filter 12 is being changed, the camera 30 takes images of the first and second dies. Specifically, the movement mechanism 41 sets the wavelength band of light passing through the wavelength selection filter 12 to a first wavelength band. While the optical system 2 is emitting light in the first wavelength band as the first optical condition to the sample substrate, the camera 30 takes images of the first and second dies, respectively. In this way, the control arithmetic unit 40 can acquire first and second sample images taken using the light in the first wavelength band. The first and second sample images correspond to the first and second dies, respectively. Subsequently, the movement mechanism 41 changes the wavelength band of the light passing through the wavelength selection filter 12 from the first wavelength band to the second wavelength band. While the optical system 2 is emitting light in the second wavelength band as the second optical condition to the sample substrate, the camera 30 takes images of the first and second dies, respectively. In this way, the control arithmetic unit 40 can acquire first and second sample images taken using the light in the second wavelength band.

For example, in the case where the polarization state of light is changed as the optical condition, the camera 30 may take images of the first and second dies while the movement mechanism 43 or 44 is changing the settings of the polarization filter 14 or 17. In this case, the control arithmetic unit 40 can acquire first and second sample images taken using light in a first polarization state. Moreover, the control arithmetic unit 40 can acquire first and second sample images taken using light in a second polarization state.

For example, in the case where the size or shape of the aperture 13 or 18 is changed as the optical condition, the camera 30 may take images of the first and second dies while the movement mechanism 42 or 45 is changing the size or shape of the aperture 13 or 18. In this case, the control arithmetic unit 40 can acquire first and second sample images taken using light that has passed through the aperture 13. Moreover, the control arithmetic unit 40 can acquire first and second sample images taken using light that has passed through the aperture 18.

For example, in the case where the imaging plane location (focusing position) is changed as the optical condition, the camera 30 may take images of the first and second dies while the movement mechanism 46 is varying the height of the stage 20. In this case, the control arithmetic unit 40 can acquire first and second sample images taken at a first focusing position. Moreover, the control arithmetic unit 40 can acquire first and second sample images taken at a second focusing position.

In the above examples, the camera 30 takes images of the first and second dies, respectively, under two optical conditions (the first and second optical conditions). However, practically, images are taken under three or a more number of optical conditions. By taking many sample images while changing the numerical value or the like in a certain optical condition, the control arithmetic unit 40 can extract an optical condition that gives a large brightness difference $|\Delta C1-\Delta C2|$, from many sample images, as explained with reference to FIGS. 6A to 7E.

Figures 4A, 4B, 4C:
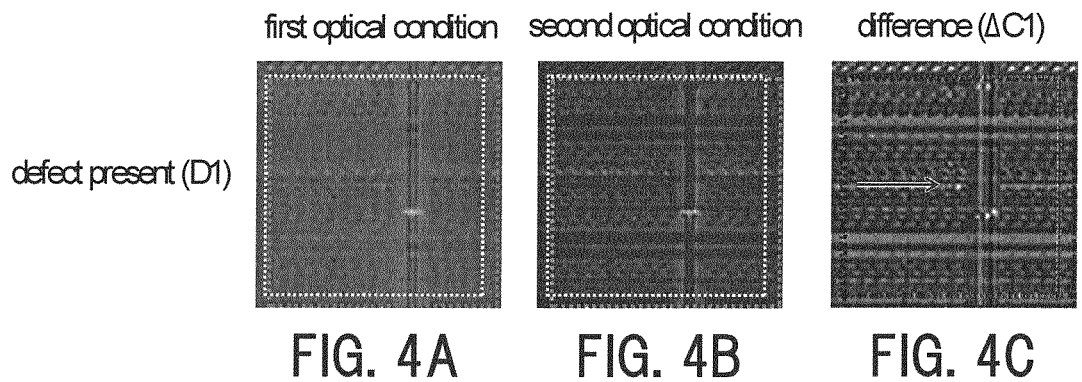
FIGS. 4A to 4C are illustrations showing examples of a first sample image of a first die having a defect.

FIGS. 4A and 4B each are an illustration showing one example of a plurality of first sample images of a first die D1 having a defect. FIG. 4A shows a first sample image of the first die D1 taken under the first optical condition. FIG. 4B shows a first sample image of the first die D1 taken under the second optical condition. The first sample image in each of FIGS. 4A and 4B is image data expressed in gray level.

The control arithmetic unit 40 calculates a brightness difference (gradation difference) between the first sample image taken under the first optical condition and the first sample image taken under the second optical condition (S32). For example, FIG. 4C shows the brightness difference between the first sample image taken under the first optical condition in FIG. 4A and the first sample image taken under the second optical condition in FIG. 4B.

Figures 5A, 5B, 5C:
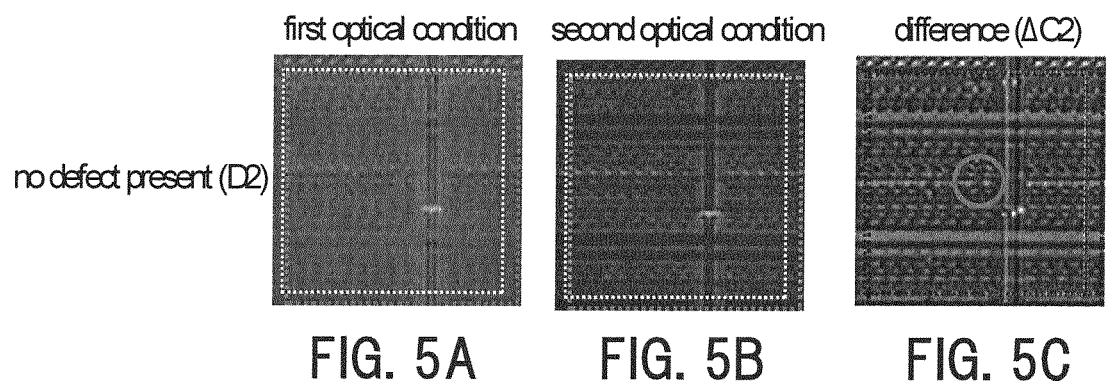
FIGS. 5A to 5C are illustrations showing examples of a second sample image of a second die having no defects.
Figures 6A, 6B, 6C, 6D, 6E:
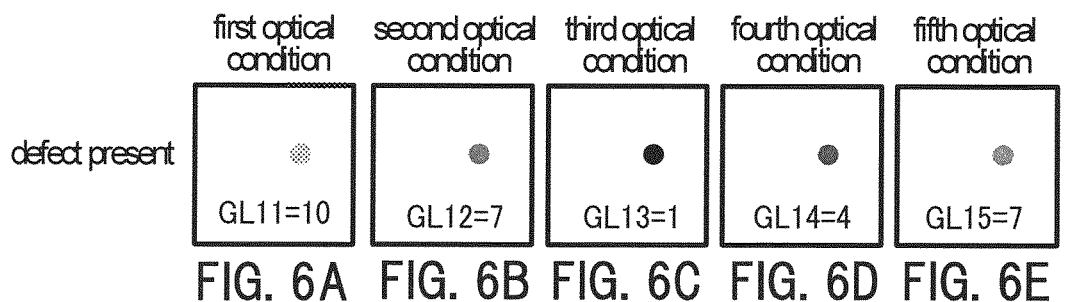
FIGS. 6A to 6E are illustrations showing gray levels of critical locations in a plurality of first sample images of the first die.
Figures 7A, 7B, 7C, 7D, 7E:
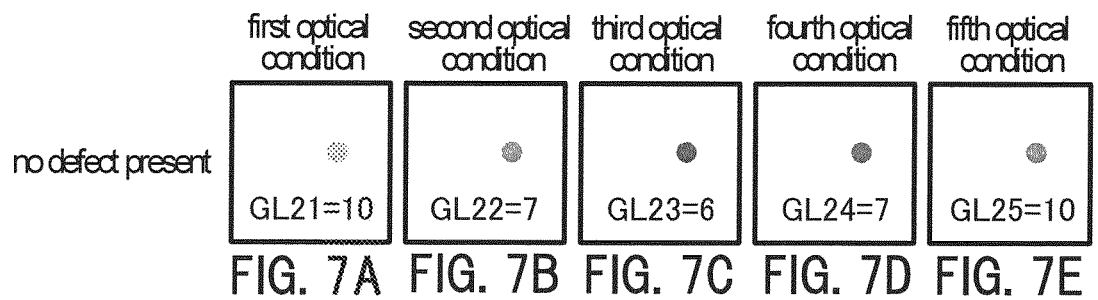
FIGS. 7A to 7E are illustrations showing gray levels of critical locations in a plurality of second sample images of the second die.

FIGS. 5A and 5B each are an illustration showing one example of a plurality of second sample images of a second die D2 having no defects. FIG. 5A shows a second sample image of the second die D2 taken under the first optical condition. FIG. 5B shows a second sample image of the second die D2 taken under the second optical condition. The second sample image in each of FIGS. 5A and 5B is image data expressed in gray level.

The control arithmetic unit 40 calculates a brightness difference (gradation difference) between the second sample image taken under the first optical condition and the second sample image taken under the second optical condition (S34). For example, FIG. 5C shows the brightness difference between the second sample image taken under the first optical condition in FIG. 5A and the second sample image taken under the second optical condition in FIG. 5B.

It is defined here that the brightness difference between the first sample image taken under the first optical condition and the first sample image taken under the second optical condition is a first brightness difference $\Delta C1$, and the brightness difference between the second sample image taken under the first optical condition and the second sample image taken under the second optical condition is a second brightness difference $\Delta C2$. The control arithmetic unit 40 calculates a difference $|\Delta C1-\Delta C2|$ between the first brightness difference $\Delta C1$ and the second brightness difference $\Delta C2$ (S40). The difference $|\Delta C1-\Delta C2|$ expresses a brightness difference according to whether there is a defect or not. Therefore, it is easier to detect a defect, as the difference $|\Delta C1-\Delta C2|$ becomes larger.

Subsequently, the control arithmetic unit 40 selects a combination of the first and second optical conditions under which the difference $|\Delta C1-\Delta C2|$ becomes largest, as first and second inspection optical conditions (S50).

For example, FIGS. 6A to 6E are illustrations showing gray levels of critical locations in a plurality of first sample images of the first die D1. FIGS. 6A to 6E show gray levels of critical locations in first sample images taken under the first to fifth optical conditions, respectively. The critical location in the first sample image corresponding to the first optical condition has a gray level GL11 of 10. The critical location in the first sample image corresponding to the second optical condition has a gray level GL12 of 7. The critical location in the first sample image corresponding to the third optical condition has a gray level GL13 of 1. The critical location in the first sample image corresponding to the fourth optical condition has a gray level GL14 of 4. The critical location in the first sample image corresponding to the fifth optical condition has a gray level GL15 of 7.

There is a brightness difference (first brightness difference) $\Delta C1\_12$ of 3 between the gray levels GL11 and GL12. There is a brightness difference $\Delta C1\_13$ of 9 between the gray levels GL11 and GL13. There is a brightness difference $\Delta C1\_14$ of 6 between the gray levels GL11 and GL14. In the same manner, the control arithmetic unit 40 calculates a brightness difference $\Delta C1\_mn$ between gray levels $GL1m$ and $GL1n$ for all of the combinations of optical conditions, m and n being a natural number.

FIGS. 7A to 7E are illustrations showing gray levels of critical locations in a plurality of second sample images of the second die D2. FIGS. 7A to 7E show gray levels of critical locations in second sample images taken under the first to fifth optical conditions, respectively. The critical location in the second sample image corresponding to the first optical condition has a gray level GL21 of 10. The critical location in the second sample image corresponding to the second optical condition has a gray level GL22 of 7. The critical location in the second sample image corresponding to the third optical condition has a gray level GL23 of 1. The critical location in the second sample image corresponding to the fourth optical condition has a gray level GL24 of 4. The critical location in the second sample image corresponding to the fifth optical condition has a gray level GL25 of 7.

There is a brightness difference (second brightness difference) $\Delta C2\_12$ of 3 between the gray levels GL21 and GL22. There is a brightness difference $\Delta C1\_13$ of 4 between the gray levels GL21 and GL23. There is a brightness difference $\Delta C2\_14$ of 3 between the gray levels GL21 and GL24. In the same manner, the control arithmetic unit 40 calculates a brightness difference $\Delta C2\_mn$ between gray levels GL2$m$ and GL2$n$ for all of the combinations of optical conditions.

Moreover, the control arithmetic unit 40 calculates the difference $|\Delta C1-\Delta C2|$. In the examples of FIGS. 6 and 7, the control arithmetic unit 40 calculates a difference $|\Delta C1\_mn-\Delta C2\_mn|$. In this case, the control arithmetic unit 40 selects a combination of first and second optical conditions under which the difference $|\Delta C1\_mn-\Delta C2\_mn|$ becomes largest, as the first and second inspection optical conditions. For example, in the examples of FIGS. 6 and 7, at (m, n)=(1, 3), the difference $|\Delta C1\_mn-\Delta C2\_mn|$ is 5 which is the largest. Therefore, the control arithmetic unit 40 selects a combination of the first and third optical conditions, as the first and second inspection optical conditions.

As described above, the defect inspection apparatus 1 according to the present embodiment can automatically select the first and second inspection optical conditions using the sample substrate. The first and second inspection optical conditions are stored in the storage 47. Thereafter, the first and second inspection optical conditions are used in inspection of the pattern of the semiconductor substrate W to be inspected.

The first and second inspection optical conditions are selected for other critical locations in the same manner as described above and stored in the storage 47. In other words, the first and second inspection optical conditions are determined for each of a plurality of critical locations. Numerical values or the like in the first and second inspection optical conditions may be different depending the critical locations. The kind of the first and second inspection optical conditions may also be different depending on the critical locations. For example, the first and second inspection optical conditions may be different from each other in light wavelength in a critical location and may be different from each other in light polarization state in another critical location.

If there is another critical location (YES in S55), Steps S30 to S50 are repeatedly executed. On the other hand, if there is no other critical location (NO in S55), it means that the first and second inspection optical conditions have been determined for all of the critical locations of the sample substrate. Therefore, the process proceeds to an inspection step of Step S60.

The sample substrate is removed from the stage 20 and the semiconductor substrate W to be inspected is placed on the stage 20 (S60). The semiconductor substrate W preferably has the same pattern as the sample substrate.

Subsequently, the camera 30 takes an image of a critical location of the semiconductor substrate W under the first inspection optical condition to acquire a first inspection image. The camera 30 also takes an image of the same critical location of the semiconductor substrate W under the second inspection optical condition to acquire a second inspection image (S70). The first and second inspection images are converted by the image processing unit 50 into image data expressed in gray level. The first and second inspection images are transferred to the control arithmetic unit 40 and stored in the storage 47.

Subsequently, the control arithmetic unit 40 determines whether there is a defect in the critical location based on the brightness difference between the first and second inspection images (S80). For example, if the brightness difference between the first and second inspection images is smaller than a threshold value (YES in S80), the control arithmetic unit 40 determines that there is no defect in that critical location (S91). On the other hand, if the brightness difference between the first and second inspection images is equal to or larger than the threshold value (NO in S80), the control arithmetic unit 40 determines that there is a defect in that critical location (S92). The threshold value may be preset and stored in the storage 47.

The threshold value may be set in the middle of a gray level difference of the first sample image under the first and second inspection optical conditions. For example, in the examples of FIGS. 6 and 7, the threshold value may be set to an intermediate gray level between the gray level GL11 under the first optical condition that corresponds to the first inspection optical condition and the gray level GL13 under the third optical condition that corresponds to the second inspection optical condition, the set threshold value being stored in the storage 47.

If there is another defect location (YES in S100), the control arithmetic unit 40 executes Steps S70 to S92 for the other defect locations. On the other hand, if there is no other defect location (NO in S100), the defect inspection on the semiconductor substrate W ends.

According to the present embodiment, the first and second inspection optical conditions are selected so that the brightness difference ($|\Delta C1-\Delta C2|$), which depends on whether there is a defect in a critical location, becomes largest. By inspecting the semiconductor substrate W using such first and second inspection optical conditions, the brightness difference between the first and second inspection images can be largely different depending on whether there is a defect. Therefore, the control arithmetic unit 40 can automatically inspect whether there is a defect in a critical location, relatively easily. Moreover, according to the present embodiment, it can be determined whether there is a defect, in a relatively short time and accurately, with no necessity of visual inspection by an operator.

At least part of the defect inspection method according to the present embodiment may be configured with hardware or software. When it is configured with software, a program that performs at least part of the defect inspection method may be stored in a storage medium such as a flexible disk and CD-ROM, and then installed in a computer to run thereon. The storage medium may not be limited to a detachable one such as a magnetic disk and an optical disk but may be a standalone type such as a hard disk and a memory. Moreover, a program that achieves the function of at least part of the defect inspection method may be distributed via a communication network a (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A defect inspection apparatus comprising:
    an illuminating portion emitting light to a pattern;
    an imaging portion acquiring a plurality of first sample images by taking images of the pattern in a first sample under a plurality of optical conditions, the first sample having a defect in a first area of the pattern, and acquiring a plurality of second sample images by taking images of the pattern in a second sample under a plurality of optical conditions, the second sample having no defects in the first area of the pattern; and
    an arithmetic portion calculating a first difference between a first sample image taken under a first optical condition and a first sample image taken under a second optical condition, among the plurality of optical conditions, calculating a second difference between a second sample image taken under the first optical condition and a second sample image taken under the second optical condition, and selecting the first and second optical conditions under which a difference between the first and second differences becomes largest, as a first and a second inspection condition,
    wherein the imaging portion takes images of the pattern in a target to be inspected under the first and second inspection conditions to acquire a first and a second inspection image, and
    the arithmetic portion determines whether there is a defect in the first area of the pattern in the target based on a difference between the first and second inspection images.

2. The defect inspection apparatus according to claim 1, wherein the arithmetic portion determines that there is no defect in the first area if the difference between the first and second inspection images is smaller than a threshold value, whereas determines that there is a defect in the first area if the difference between the first and second inspection images is equal to or larger than the threshold value.

3. The defect inspection apparatus according to claim 2, wherein the plurality of optical conditions are different from one another in any one of a wavelength of the light from the illuminating portion, polarization of the illuminating portion, an aperture of a lens provided to the illuminating portion, and an imaging plane location.

4. The defect inspection apparatus according to claim 2, wherein the first and second optical conditions are different from each other in height of a stage on which the target to be inspected is placed.

5. The defect inspection apparatus according to claim 2, wherein the first and second differences are calculated based on a brightness difference between the first and second sample images.

6. The defect inspection apparatus according to claim 1, wherein the plurality of optical conditions are different from one another in any one of a wavelength of the light from the illuminating portion, polarization of the illuminating portion, an aperture of a lens provided to the illuminating portion, and an imaging plane location.

7. The defect inspection apparatus according to claim 1, wherein the first and second optical conditions are different from each other in height of a stage on which the target to be inspected is placed.

8. The defect inspection apparatus according to claim 1, wherein the first and second differences are calculated based on a brightness difference between the first and second sample images.

9. A defect inspection method using a defect inspection apparatus comprising an illuminating portion emitting light to a pattern, an imaging portion taking an image of the pattern, and an arithmetic portion inspecting a defect of the pattern, comprising:
    acquiring a plurality of first sample images by taking images of the pattern in a first sample under a plurality of optical conditions, the first sample having a defect in a first area of the pattern;
    acquiring a plurality of second sample images by taking images of the pattern in a second sample under a plurality of optical conditions, the second sample having no defects in the first area of the pattern;
    calculating a first difference between a first sample image taken under a first optical condition and a first sample image taken under a second optical condition, among the plurality of optical conditions;
    calculating a second difference between a second sample image taken under the first optical condition and a second sample image taken under the second optical condition;
    selecting the first and second optical conditions under which a difference between the first and second differences becomes largest, as a first and a second inspection condition;
    taking images of a location of the target to be inspected under the first and second inspection conditions to acquire a first and a second inspection image, and
    determining whether there is a defect in the first area of the pattern in the target based on a difference between the first and second inspection images.

10. The defect inspection method according to claim 9, wherein the arithmetic portion determines that there is no defect in the first area if the difference between the first and second inspection images is smaller than a threshold value, whereas determines that there is a defect in the first area if the difference between the first and second inspection images is equal to or larger than the threshold value.

11. The defect inspection method according to claim 10, wherein the plurality of optical conditions are different from one another in any one of a wavelength of the light from the illuminating portion, polarization of the illuminating portion, an aperture of a lens provided to the illuminating portion, and an imaging plane location.

12. The defect inspection method according to claim 10, wherein the first and second optical conditions are different from each other in height of a stage on which the target to be inspected is placed.

13. The defect inspection apparatus according to claim 9, wherein the plurality of optical conditions are different from one another in any one of a wavelength of the light from the illuminating portion, polarization of the illuminating portion, an aperture of a lens provided to the illuminating portion, and an imaging plane location.

14. The defect inspection method according to claim 13, wherein the first and second optical conditions are different from each other in height of a stage on which the target to be inspected is placed.

15. The defect inspection method according to claim 9, wherein the first and second optical conditions are different from each other in height of a stage on which the target to be inspected is placed.

16. A semiconductor device manufacturing method using a defect inspection apparatus comprising an illuminating portion emitting light to a pattern formed with a mask on a semiconductor substrate, an imaging portion taking an image of the pattern, and an arithmetic portion inspecting a defect of the pattern, comprising:

acquiring a plurality of first sample images by taking images of the pattern in a first sample under a plurality of optical conditions, the first sample having a defect in a first area of the pattern;

acquiring a plurality of second sample images by taking images of the pattern in a second sample under a plurality of optical conditions, the second sample having no defects in the first area of the pattern;

calculating a first difference between a first sample image taken under a first optical condition and a first sample image taken under a second optical condition, among the plurality of optical conditions;

calculating a second difference between a second sample image taken under the first optical condition and a second sample image taken under the second optical condition;

selecting the first and second optical conditions under which a difference between the first and second differences becomes largest, as a first and a second inspection condition;

taking images of a location of the target to be inspected under the first and second inspection conditions to acquire a first and a second inspection image, and determining whether there is a defect in the first area of the pattern in the target based on a difference between the first and second inspection images.

\* \* \* \* \*